(12) United States Patent
Chen et al.

(10) Patent No.: US 11,019,750 B2
(45) Date of Patent: *May 25, 2021

(54) WATER-COOLING HEAD

(71) Applicant: AURAS Technology Co., Ltd., New Taipei (TW)

(72) Inventors: Chien-An Chen, New Taipei (TW); Mu-Shu Fan, New Taipei (TW); Chien-Yu Chen, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 163 days.

This patent is subject to a terminal disclaimer.

(21) Appl. No.: 16/124,867

(22) Filed: Sep. 7, 2018

(65) Prior Publication Data
US 2019/0343018 A1 Nov. 7, 2019

Related U.S. Application Data

(60) Provisional application No. 62/666,733, filed on May 4, 2018.

(30) Foreign Application Priority Data

Aug. 3, 2018 (TW) .................................. 107127124

(51) Int. Cl.
*H05K 7/20* (2006.01)
*F28D 1/02* (2006.01)

(52) U.S. Cl.
CPC ....... *H05K 7/20263* (2013.01); *F28D 1/0233* (2013.01); *H05K 7/20272* (2013.01); *F28D 2001/0253* (2013.01); *H05K 7/20218* (2013.01)

(58) Field of Classification Search
CPC .......... H05K 7/20263; H05K 7/20272; H05K 7/20218; F28D 1/0233; F28D 2001/0253
USPC ........................................... 165/80.5, 104.33
See application file for complete search history.

(56) References Cited

U.S. PATENT DOCUMENTS

2004/0052049 A1* 3/2004 Wu ..................... F28D 15/0266
361/699
2017/0184116 A1* 6/2017 Guo ..................... F04D 29/086

* cited by examiner

*Primary Examiner* — Joel M Attey
(74) *Attorney, Agent, or Firm* — WPAT, PC

(57) ABSTRACT

A water-cooling head includes a casing, a base, a thermal conduction structure and a pump. An active space is defined by the base and the casing collaboratively. A working medium is filled in the active space. The pump includes a fixing element, a shaft and an impeller. After the fixing element is fixed, the fixing element is contacted with the base or contacted with the thermal conduction structure, and the shaft is fixed on the fixing element. Consequently, the impeller is stably rotated about the shaft, and the performance and the reliability of the water-cooling head are enhanced.

27 Claims, 16 Drawing Sheets

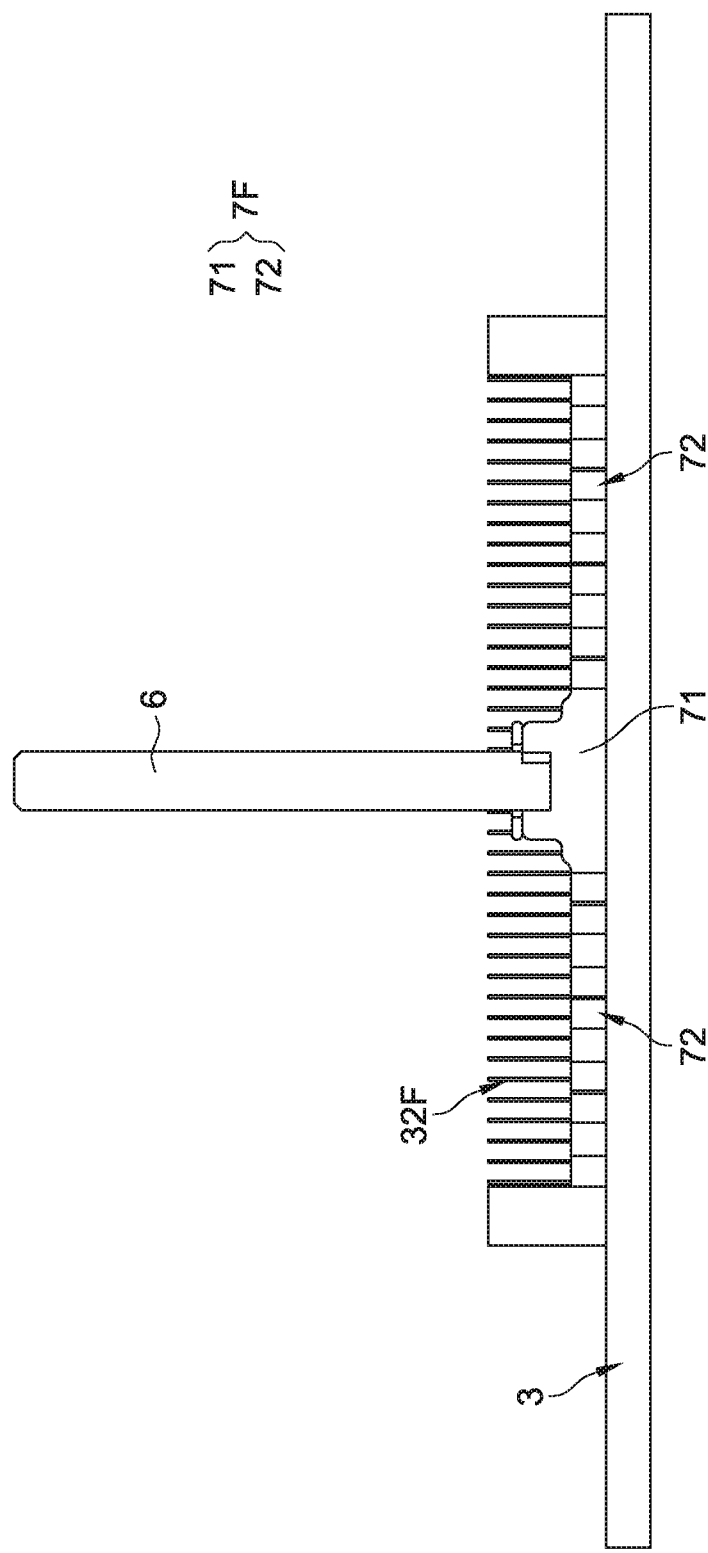

WATER-COOLING HEAD

FIELD OF THE INVENTION

The present invention relates to a heat dissipation module, and more particularly to a water-cooling head.

BACKGROUND OF THE INVENTION

With increasing development of computers and various electronic products, people of the modern societies often spend lot of time in using computers and various electronic products. In case that the computer or the electronic product has been operated for a long time, the heat generated by the computer or the electronic product cannot be dissipated away quickly.

Generally, for most of the electronic products, thermal greases or heat sinks are attached on the heat generation components of the electronic products to absorb the heat from the heat generation components and dissipate the heat away. As known, the heat dissipating efficiency of using the thermal grease or the heat sink is usually unsatisfied. For solving this drawback, a liquid-cooling heat dissipating module has been disclosed.

FIG. 1 schematically illustrates the architecture of a conventional liquid-cooling heat dissipating module. As shown in FIG. 1, the liquid-cooling heat dissipating module 9 comprises a water-cooling radiator 91, a water-cooling head 92 and a pump 93. Every two of the water-cooling radiator 91, the water-cooling head 92 and the pump 93 are connected with each other through a pipe 94. Consequently, the water-cooling radiator 91, the water-cooling head 92 and the pump 93 are in fluid communication with each other. The water-cooling head 92 is in thermal contact with a heat generation component (not shown) of an electronic product (not shown). A working medium (not shown) within the water-cooling head 92 is heated by the heat. The working medium flows to the low-temperature site of the liquid-cooling heat dissipating module 9 to perform the heat exchange. The pump 93 drives the working medium to flow within a loop of the liquid-cooling heat dissipating module 9.

When the purpose of reducing the overall volume of the heat dissipating module, the purpose of increasing the installation flexibility of the heat dissipating module, the purpose of simplifying the structure or any other specified purpose is taken into consideration, a water-cooling head with a built-in pump has been disclosed. That is, the pump is directly installed in the water-cooling head of the heat dissipating module, and the impeller of the pump drives the working medium to flow. For increasing the performance and the reliability of the water-cooling head, the water-cooling head has to be specially designed. For example, it is important to constantly rotate the impeller of the pump about the same axis center without deviation, flip or vibration. Moreover, the positions of the impeller and associated components also influence the heat transfer performance and the heat conduction performance of the water-cooling head.

SUMMARY OF THE INVENTION

For solving the drawbacks of the conventional technologies, the present invention provides a water-cooling head with a built-in pump. After a fixing element is installed, the fixing element is contacted with a base or a thermal conduction structure to fix a shaft. Consequently, an impeller is stably rotated about the shaft. In such way, the performance and the reliability of the water-cooling head are enhanced.

In accordance with an aspect of the present invention, there is provided a water-cooling head. The water-cooling head includes a casing, a base, a thermal conduction structure and a pump. An active space is defined by the base and the casing collaboratively. A working medium is filled in the active space. The thermal conduction structure is disposed on an inner side of the base. When an outer side of the base is in contact with a heat source to absorb heat, the heat is transferred to the working medium through the base and thermal conduction structure sequentially. The pump includes a fixing element, a shaft and an impeller. After the fixing element is fixed, the fixing element is contacted with the base or contacted with the thermal conduction structure, and the shaft is installed and fixed on the fixing element. The impeller is sheathed around the shaft and rotated about the shaft to drive the working medium to flow.

In an embodiment, the thermal conduction structure is a fin group or a sintered heat-dissipating structure.

In an embodiment, a first end of the shaft is fixed on the fixing element, and a second end of the shaft is fixed on an inner side of the casing.

In an embodiment, the fixing element and the thermal conduction structure are fixedly connected with each other.

In an embodiment, the thermal conduction structure includes plural fins, and the fixing element is fixedly connected with a top end of at least one of the plural fins.

In an embodiment, the thermal conduction structure includes a concave structure, and at least a portion of the fixing element is accommodated within the concave structure.

In an embodiment, the fixing element and the base are fixedly connected with each other.

In an embodiment, the fixing element and the casing are fixedly connected with each other.

In an embodiment, the fixing element includes at least one wing part and a pedestal. An end of the shaft is fixed on the pedestal. A first end of each wing part is connected with the pedestal. A second end of each wing part is extended toward the casing and fixedly connected with the casing.

In an embodiment, each wing part includes at least one opening, and the working medium flows through the at least one opening.

In an embodiment, the thermal conduction structure includes plural fins. When the fixing element is fixedly connected with the casing, the fixing element is contacted with a top end of at least one of the plural fins.

In an embodiment, the thermal conduction structure includes a concave structure. When the fixing element is fixedly connected with the casing, at least a portion of the fixing element is accommodated within the concave structure.

In an embodiment, the thermal conduction structure includes plural fins. When the fixing element is fixedly connected with the casing, the fixing element is contacted with an inner side of the base.

In an embodiment, the water-cooling head further includes an input channel and an output channel, which are in communication with the active space. The water-cooling head is connected with a heat changer. The working medium is cooled by the heat changer after the working medium is outputted from the output channel. The cooled working medium is introduced into the active space through the input channel.

In accordance with another aspect of the present invention, there is provided a water-cooling head. The water-cooling head includes an active space, a thermal conduction structure and a pump. A working medium is filled in the active space. The thermal conduction structure is disposed on a base and accommodated within the active space. When the base is in contact with a heat source to absorb heat, the heat is transferred to the working medium through the base and thermal conduction structure sequentially. The pump includes a fixing element, a shaft and an impeller. After the fixing element is fixed, the fixing element is contacted with the base or contacted with the thermal conduction structure. The shaft is installed and fixed on the fixing element. The impeller is sheathed around the shaft. The active space is divided into plural spaces by the impeller. When the impeller is rotated about the shaft, the working medium is driven to flow.

In an embodiment, the plural spaces include a heat-absorbing space and a drainage space, and the thermal conduction structure is accommodated within the heat-absorbing space.

In an embodiment, the thermal conduction structure is a fin group or a sintered heat-dissipating structure.

In an embodiment, the fixing element and the thermal conduction structure are fixedly connected with each other.

In an embodiment, the thermal conduction structure includes plural fins, and the fixing element is fixedly connected with a top end of at least one of the plural fins.

In an embodiment, the thermal conduction structure includes a concave structure, and at least a portion of the fixing element is accommodated within the concave structure.

In an embodiment, the fixing element and the base are fixedly connected with each other.

In an embodiment, the water-cooling head further includes a casing. The active space is defined by the casing and the base collaboratively. The fixing element and the casing are fixedly connected with each other.

In an embodiment, the fixing element includes at least one wing part and a pedestal. An end of the shaft is fixed on the pedestal. A first end of each wing part is connected with the pedestal. A second end of each wing part is extended toward the casing and fixedly connected with the casing.

In an embodiment, each wing part includes at least one opening, and the working medium flows through the at least one opening.

In an embodiment, the thermal conduction structure includes plural fins. When the fixing element and the casing are fixedly connected with each other, the fixing element is contacted with a top end of at least one of the plural fins.

In an embodiment, the thermal conduction structure includes a concave structure. When the fixing element is fixedly connected with the casing, at least a portion of the fixing element is accommodated within the concave structure.

In an embodiment, when the fixing element and the casing are fixedly connected with each other, the fixing element is contacted with an inner side of the base.

In an embodiment, the water-cooling head further includes an input channel and an output channel, which are in communication with the active space. The water-cooling head is connected with a heat changer. The working medium is cooled by the heat changer after the working medium is outputted from the output channel. The cooled working medium is introduced into the active space through the input channel.

From the above descriptions, the water-cooling heat has the built-in pump. The pump includes the fixing element and the shaft. After the fixing element is fixed, the fixing element is contacted with the base or contacted with the thermal conduction structure, and the shaft is fixed on the fixing element. The impeller is sheathed around the shaft and stably rotated about the shaft to drive the working medium to flow. Due to the structural design, the performance and the reliability of the water-cooling head are enhanced.

The above objects and advantages of the present invention will become more readily apparent to those ordinarily skilled in the art after reviewing the following detailed description and accompanying drawings, in which:

BRIEF DESCRIPTION OF THE DRAWINGS

FIG. 16 is a schematic cross-sectional view illustrating a fixing element and a thermal conduction structure of a water-cooling head according to a sixth embodiment of the present invention when the fixing element is fixedly connected with a casing.

DETAILED DESCRIPTION OF THE PREFERRED EMBODIMENT

In the following embodiments, the arrangement of the active space in the water-cooling head, the flowing direction of the working medium and the structure and function of the impeller are presented herein for purpose of illustration and description only. It is noted that numerous modifications and alterations may be made by those skilled in the art while retaining the teachings of the invention. In this context, the term "fixed connection" between two components indicates the fixing means through adhering connection, the fixing means through locking connection, the fixing means through screwing connection, the fixing means through welding connection or the fixing means through integration and detailed descriptions thereof are omitted.

Figure 1:
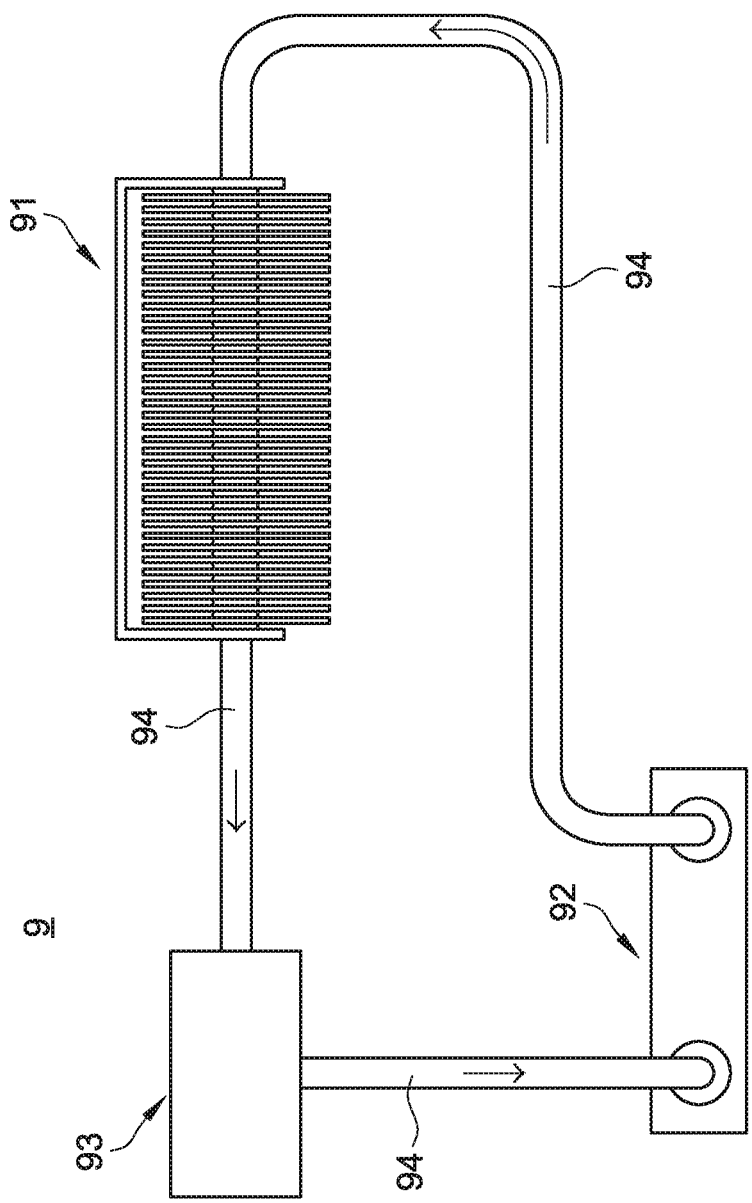
FIG. 1 schematically illustrates the architecture of a conventional liquid-cooling heat dissipating module.
Figure 2A:
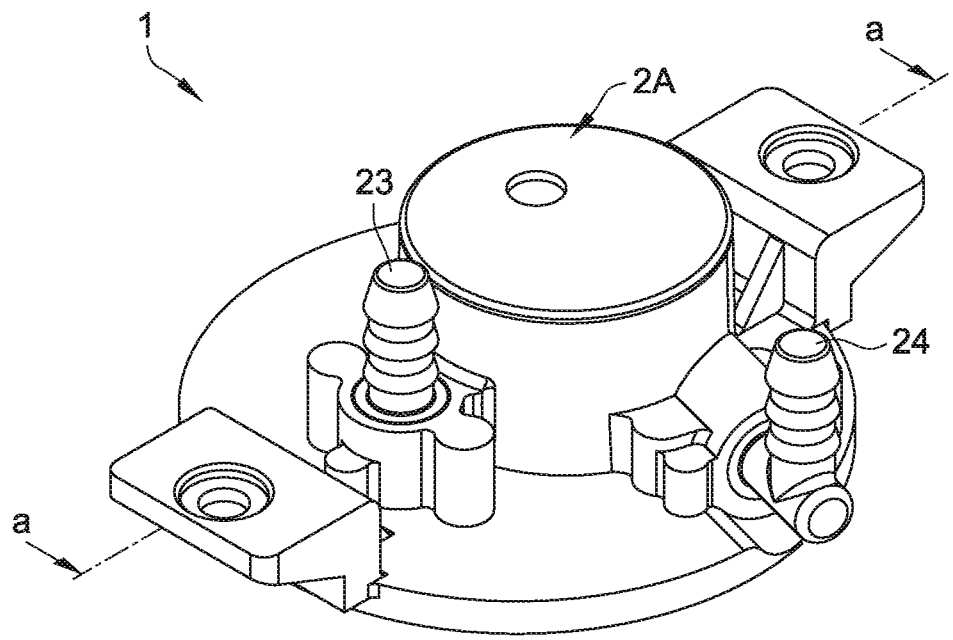
FIG. 2A is a schematic perspective view illustrating a water-cooling head according to a first embodiment of the present invention.
Figure 2B:
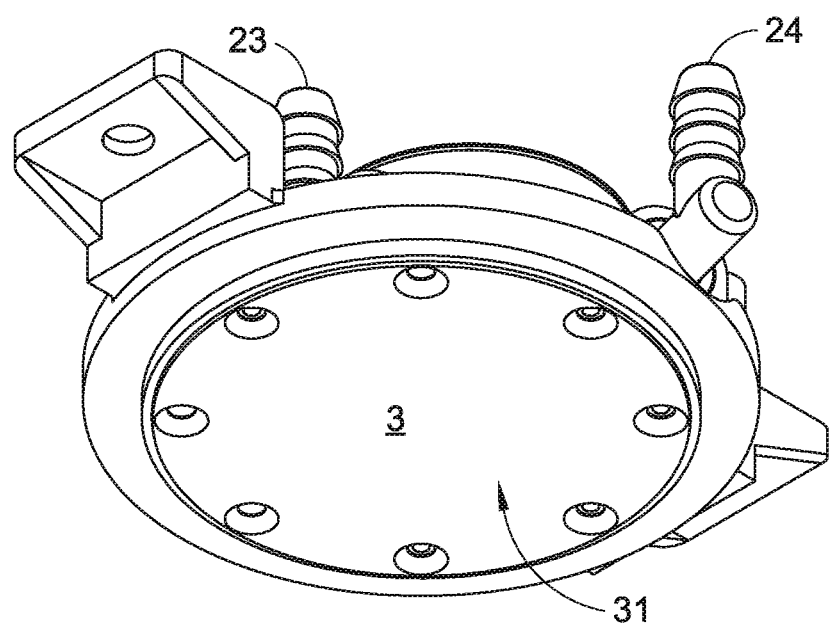
FIG. 2B is a schematic perspective view illustrating the water-cooling head of FIG. 2A and taken along another viewpoint.
Figure 3:
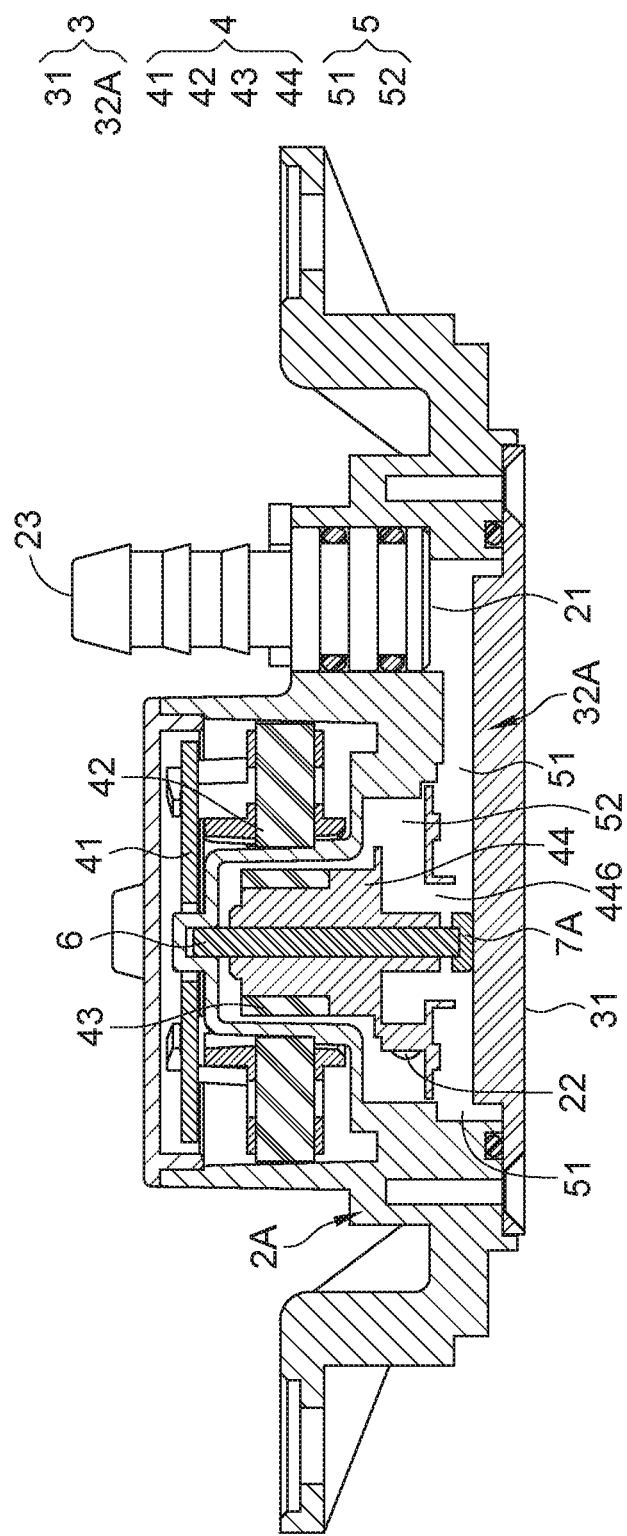
FIG. 3 is a schematic cross-sectional view illustrating the water-cooling head of FIG. 2A and taken along the line a-a.
Figure 4:
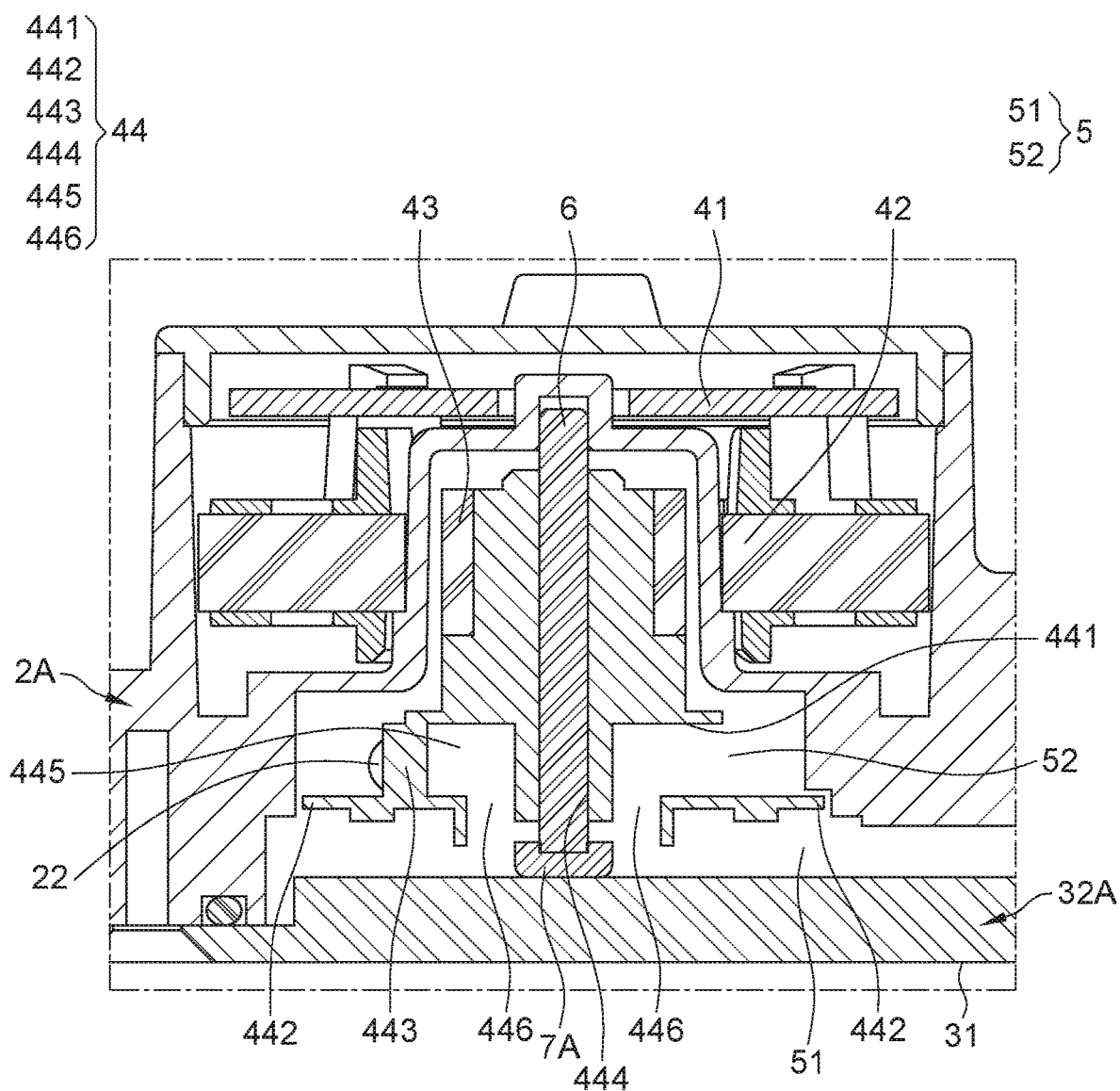
FIG. 4 is a schematic enlarged view illustrating a portion of the water-cooling head of FIG. 3.

Please refer to FIGS. 2A, 2B, 3 and 4. FIG. 2A is a schematic perspective view illustrating a water-cooling head according to a first embodiment of the present invention. FIG. 2B is a schematic perspective view illustrating the water-cooling head of FIG. 2A and taken along another viewpoint. FIG. 3 is a schematic cross-sectional view illustrating the water-cooling head of FIG. 2A and taken along the line a-a. FIG. 4 is a schematic enlarged view illustrating a portion of the water-cooling head of FIG. 3. The water-cooling head 1 comprises a casing 2A, a base 3 and a pump 4. After the casing 2A and the base 3 are combined together, an active space 5 for allowing a working medium to go through is defined. After the working medium is filled into the active space 5 by the user or the manufacturer, the heat dissipating function of the water-cooling head 1 is achieved.

The casing 2A comprises an input channel 21 and an output channel 22. The input channel 21 is in communication with the active space 5. The cooled working medium (not shown) is introduced into the active space 5 through the input channel 21. The output channel 22 is also in communication with the active space 5. The heated working medium is outputted from the active space 5 through the output channel 22.

Moreover, an input connector 23 and an output connector 24 are externally extended or installed on the input channel 21 and the output channel 22, respectively. The input connector 23 and the output connector 24 are vertically arranged or horizontally arranged. The arrangements of the input connector 23 and the output connector 24 are not restricted as long as they are allowed to be connected with other heat exchangers. After the working medium is outputted from the output channel 22, the temperature of the working medium is decreased by the heat exchanger (not shown) that is connected with the water-cooling head 1. The working medium with the decreased temperature is introduced into the active space 5 of the water-cooling head 1 again through the input channel 21.

The outer side of the base 3 has a heat-absorbing surface 31. A thermal conduction structure 32A is disposed or formed on the inner side of the base 3. When the heat-absorbing surface 31 is in contact with a heat source, the heat of the heat source is absorbed by the heat-absorbing surface 31 and transferred to the thermal conduction structure 32A. Since the thermal conduction structure 32A is in contact with the working medium, the heat is transferred from the thermal conduction structure 32A to the working medium. In an embodiment, the thermal conduction structure 32A is a fin group comprising plural fins 321A. Each fin 321A is selected from a skived fin, a pin fin, a straight fin or any other appropriate fin with an irregular shape. The type of the fin group of the thermal conduction structure 32A is not restricted as long as the contact area between the fin group and the working medium is increased to facilitate transferring the heat to the working medium. In another embodiment, the thermal conduction structure 32A is a sintered heat-dissipating structure (e.g., a capillary structure) that is formed by sintering powder, woven mesh or fiber bundle.

Please refer to FIGS. 3 and 4. The pump 4 is disposed within the water-cooling head 1 and installed on the casing 2A. The pump 4 comprises a circuit board 41, a first magnetic element 42, a second magnetic element 43 and an impeller 44. The circuit board 41 and the first magnetic element 42 are located outside the casing 2A. The second magnetic element 43 and the impeller 44 are combined together and installed within the casing 2A. That is, the combination of the second magnetic element 43 and the impeller 44 is disposed within the active space 5. The first magnetic element 42 is a silicon steel plate or a magnet. The second magnetic element 43 is a magnet. According to the interaction between the circuit board 41, the first magnetic element 42 and the second magnetic element 43, the impeller 44 is driven to guide the movement of the working medium. In addition, the impeller 44 further provides a guiding function. After the working medium is introduced into the active space 5 through the input channel 21 to absorb the heat, the impeller 44 has the function of guiding the working medium to be smoothly outputted from the output channel 22.

Figure 5:
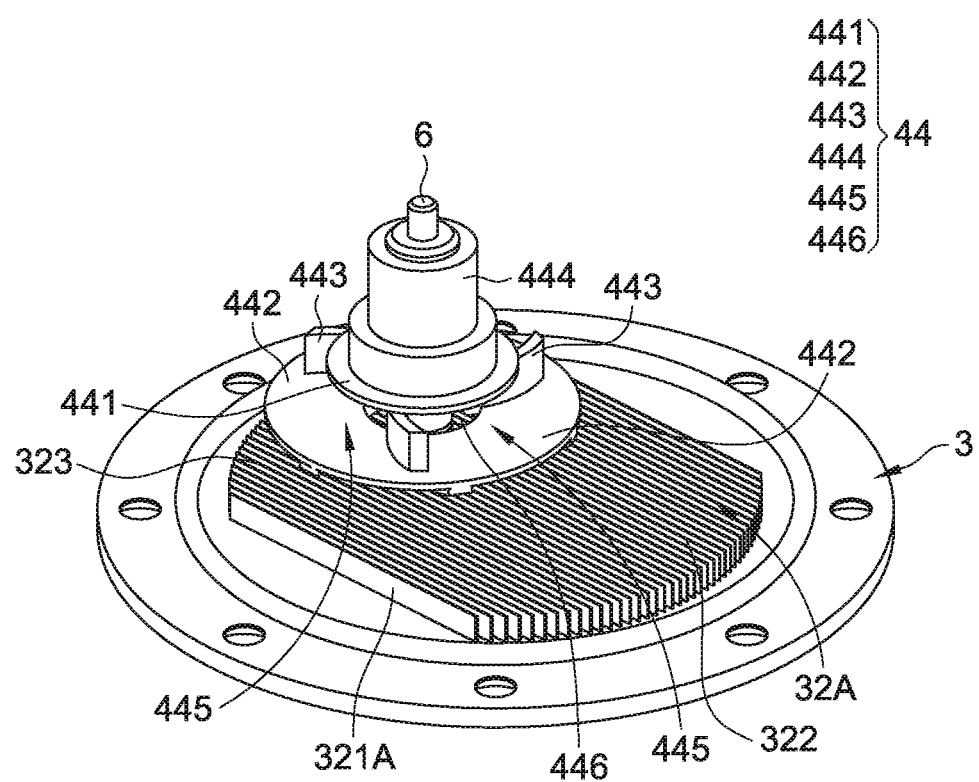
FIG. 5 is a schematic perspective view illustrating a portion of the water-cooling head as shown in FIG. 2A.
Figure 6:
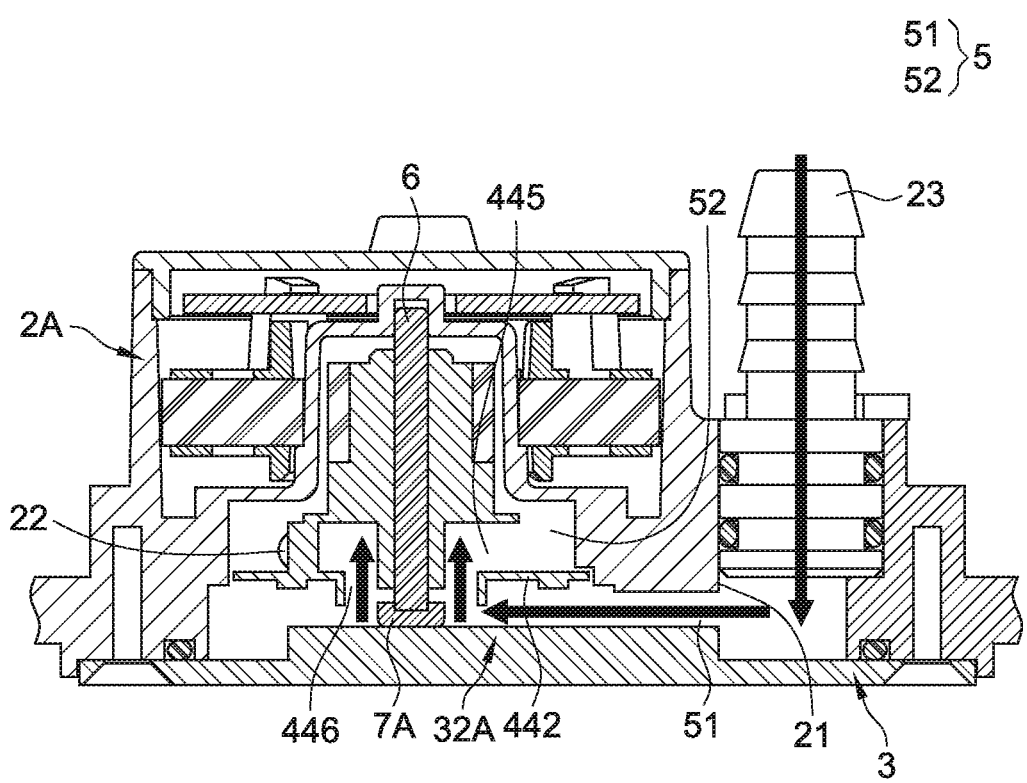
FIG. 6 is a schematic side view illustrating the path of working medium inside the water-cooling head of FIG. 2A inhaled into the impeller through the input channel and the thermal conduction structure.
Figure 7:
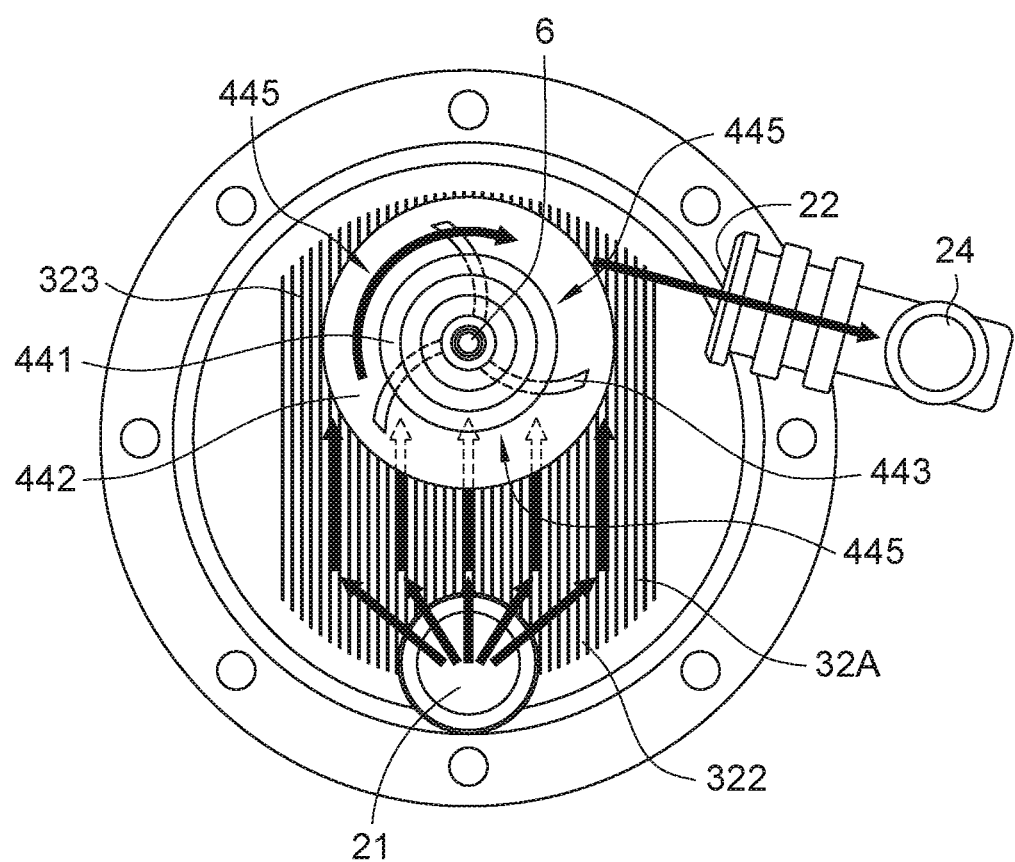
FIG. 7 is a schematic top view illustrating the path of the working medium inside the water-cooling head of FIG. 2A inhaled into the impeller through the input channel and the thermal conduction structure.
Figure 8:
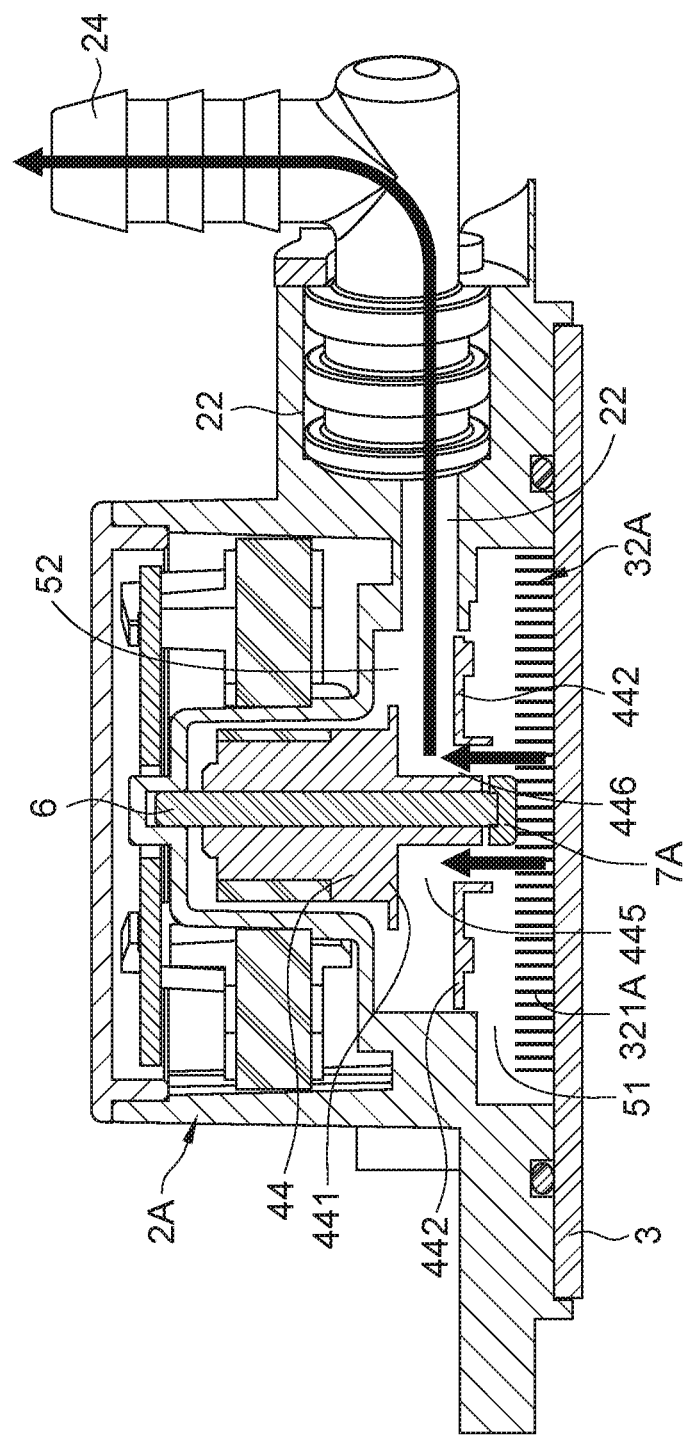
FIG. 8 is a schematic side view illustrating the path of the working medium inside the water-cooling head of FIG. 2A transferred from the thermal conduction structure to the output channel through the impeller.

Please refer to FIGS. 3 to 8. FIG. 5 is a schematic perspective view illustrating a portion of the water-cooling head as shown in FIG. 2A. FIG. 6 is a schematic side view illustrating the path of working medium inside the water-cooling head of FIG. 2A inhaled into the impeller through the input channel and the thermal conduction structure. FIG. 7 is a schematic top view illustrating the path of the working medium inside the water-cooling head of FIG. 2A inhaled into the impeller through the input channel and the thermal conduction structure. FIG. 8 is a schematic side view illustrating the path of the working medium inside the water-cooling head of FIG. 2A transferred from the thermal conduction structure to the output channel through the impeller.

In this embodiment, the impeller 44 is disposed within the active space 5 and located near the output channel 22. Consequently, the working medium can be quickly guided to the output channel 22 and outputted from the active space 5. The impeller 44 mainly comprises a seat part 442 and a hollow part 446. The active space 5 is divided into a heat-absorbing space 51 and a drainage space 52 by the seat part 442. The thermal conduction structure 32A is disposed within the heat-absorbing space 51. The working medium within the heat-absorbing space 51 and the drainage space 52 undergoes a fluidly coupling effect through the hollow part 446. Consequently, the working medium can be transferred from the heat-absorbing space 51 to the drainage space 52.

The impeller 44 further comprises an upper wall 441. The upper wall 441 and the seat part 442 are separated from each other. In addition, plural partition walls 443 are connected between the upper wall 441 and the seat part 442. The drainage space 52 is divided into plural drainage chambers 445 by the plural partition walls 443. While the working medium is transferred upwardly from the heat-absorbing space 51 to the drainage space 52 through the hollow part 446, the working medium is contacted with the upper wall 441 and then diverted to the drainage chambers 445. In other words, the upper wall 441 in this embodiment is a guiding mechanism that is able to change the flowing direction.

After the rotation of the impeller 44 is started, the working medium is attracted from the heat-absorbing space 51 to the drainage chambers 445, which are disposed within the drainage space 52. Moreover, as the drainage chambers 445 are rotated and moved across the output channel 22, the working medium is pushed into the output channel 22 and ejected out of the water-cooling head 1 in response to the centrifugal force.

In FIGS. 6, 7 and 8, the flowing direction of the working medium guided by the water-cooling head with the built-in pump is shown from different viewpoints and cross-sectional views. Please refer to FIG. 6. After the working medium is introduced into the active space 5 through the input channel 21, the working medium is transferred across the thermal conduction structure 32A to absorb the heat. Then, the working medium is inhaled by the hollow part 446 of the impeller 44 and transferred upwardly to the drainage chambers 445 between the upper wall 441 and the seat part 442. As can be seen in the top view of FIG. 7, the working medium is introduced into the input channel 21, moved from a front side 322 of the thermal conduction structure 32A to a rear side 323 of the thermal conduction structure 32A, and inhaled into the drainage chambers 445 within the drainage space 52 through the position under the hollow part 446 of the impeller 44. When the drainage chambers 445 is rotated at an angle and contacted with the output channel 22, the working medium is correspondingly outputted or pulled out. The path of ejecting the working medium from the drainage chambers 445 in the direction toward the output channel 22 can be seen in the side view of FIG. 8.

When the arranging directions of the input connector 23 and the output connector 24 and the heat absorbing efficiency of the working medium are taken into consideration, the thermal conduction structure 32A and the impeller 44 are not coaxial. That is, the thermal conduction structure 32A and the impeller 44 are in an eccentric arrangement. Consequently, the heat transfer efficiency is enhanced.

Figure 9:
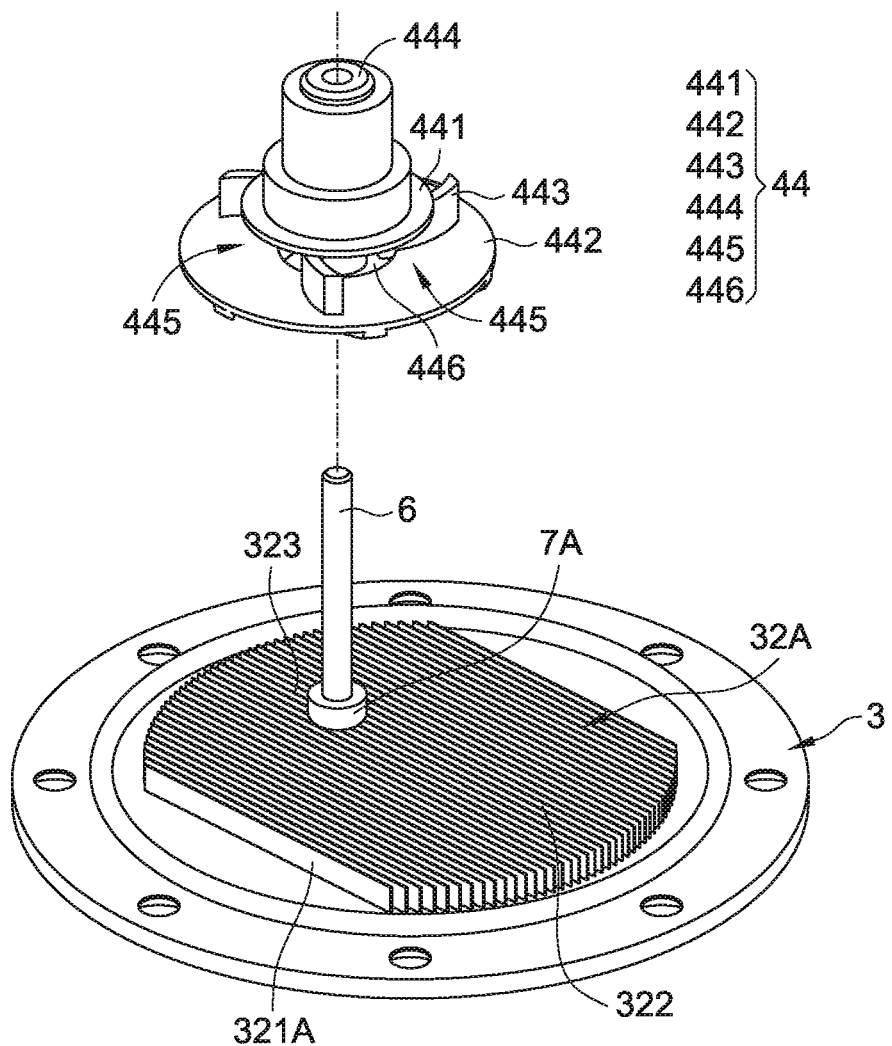
FIG. 9 is a schematic exploded view illustrating the water-cooling head as shown in FIG. 5.

Please refer to FIGS. 5, 8 and 9. FIG. 9 is a schematic exploded view illustrating the water-cooling head as shown in FIG. 5. The pump 4 of the water-cooling head 1 further comprises a shaft 6. The impeller 44 of the pump 4 further comprises a bushing 444. The bushing 444 is sheathed around the shaft 6. Consequently, the impeller 44 can be rotated about the shaft 6. Especially, the pump 4 of the water-cooling head 1 further comprises a fixing element 7A. The shaft 6 is installed on the fixing element 7A, and thus the shaft 6 is fixed. With the assistance of the fixing element 7A, the shaft 6 is not deviated, rotated or strongly vibrated. Consequently, the impeller 44 can be stably rotated within the active space 5. Moreover, the fixed position of the fixing element 7A is contacted with the thermal conduction structure 32A. Consequently, the distance between the base 3 and the impeller 44 is reduced.

In this embodiment, a first end of the shaft 6 is fixed on the fixing element 7A, and a second end of the shaft 6 is fixed on an inner side of the casing 2A. A bottom surface of the fixing element 7A is fixedly connected with the top end of at least one of the fins 321A. Consequently, the shaft 6 is not deviated, rotated or strongly vibrated. Since the impeller 44 is stably operated, the performance and reliability of the water-cooling head are enhanced.

It is noted that numerous modifications and alterations may be made by those skilled in the art while retaining the teachings of the invention. For example, in another embodiment, the second end of the shaft 6 is fixed on other component inside the casing 2A. In the above embodiment, the upper wall 441 and the seat part 442 of the impeller 44 are perpendicular to the shaft 6 (at 90 degrees). In some other embodiments, the upper wall 441 and the seat part 442 are not perpendicular to the shaft 6.

Figure 10A:
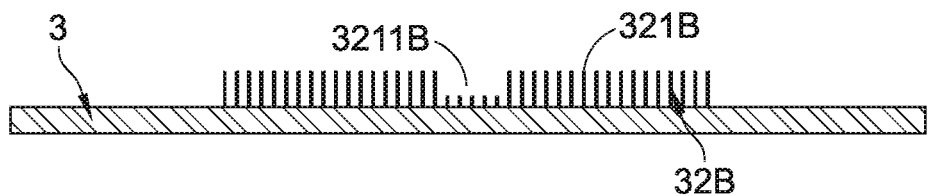
FIG. 10A is a schematic side view illustrating a base and a thermal conduction structure of a water-cooling head according to a second embodiment of the present invention.
Figure 10B:
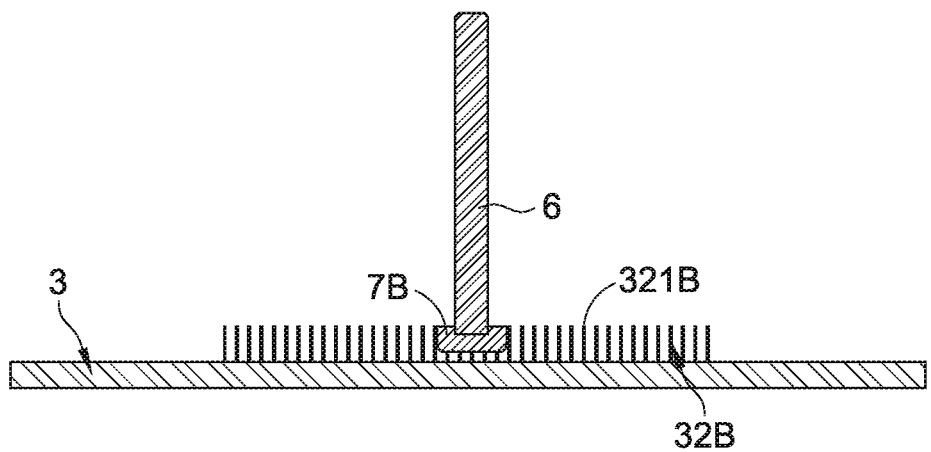
FIG. 10B is a schematic side view illustrating the relationship between a shaft, a fixing element, the thermal conduction structure and the base of FIG. 10A.

Please refer to FIGS. 10A and 10B. FIG. 10A is a schematic side view illustrating a base and a thermal conduction structure of a water-cooling head according to a second embodiment of the present invention. FIG. 10B is a schematic side view illustrating the relationship between a shaft, a fixing element, the thermal conduction structure and the base of FIG. 10A. In comparison with the first embodiment, the thermal conduction structure 32B of the water-cooling head of this embodiment is distinguished. The other components of the water-cooling head of this embodiment are similar to those of the first embodiment, and are not redundantly described herein. In this embodiment, the concave structure 3211B is defined by some of the fins 321B of the thermal conduction structure 32B collaboratively. The fixing element 7B is fixedly connected with the thermal conduction structure 32B and disposed within the concave structure 3211B. In the first embodiment, the entire of the fixing element 7A is exposed outside the thermal conduction structure 32A. Whereas, at least a portion of the fixing element 7B of this embodiment is accommodated within the concave structure 3211B. Preferably but not exclusively, at least two sides of the fixing element 7B are in close contact with the adjacent fins 321B, so that the fixing element 7B is locked on the thermal conduction structure 32B.

Figure 11A:
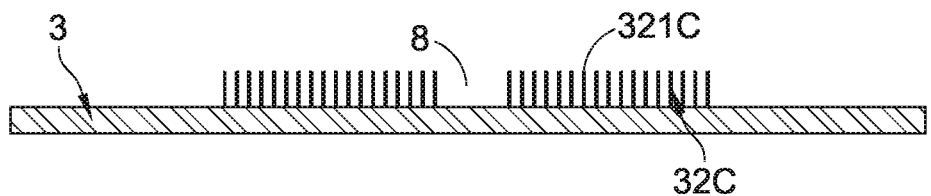
FIG. 11A is a schematic side view illustrating a base and a thermal conduction structure of a water-cooling head according to a third embodiment of the present invention.
Figure 11B:
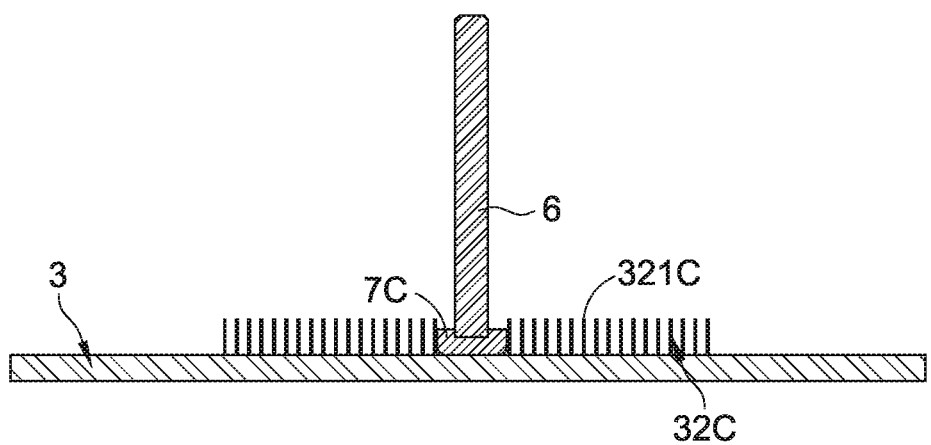
FIG. 11B is a schematic side view illustrating the relationship between a shaft, a fixing element, the thermal conduction structure and the base of FIG. 11A.

Please refer to FIGS. 11A and 11B. FIG. 11A is a schematic side view illustrating a base and a thermal conduction structure of a water-cooling head according to a third embodiment of the present invention. FIG. 11B is a schematic side view illustrating the relationship between a shaft, a fixing element, the thermal conduction structure and the base of FIG. 11A. In comparison with the first embodiment, the thermal conduction structure 32C of the water-cooling head of this embodiment is distinguished. The other components of the water-cooling head of this embodiment are similar to those of the first embodiment, and are not redundantly described herein. In this embodiment, the fixing element 7C is contacted with the base 3 and fixedly connected with the base 3, so that the fixing element 7C is fixed. This design is also helpful to reduce the distance between the base 3 and the impeller 44. In this embodiment, the thermal conduction structure 32C has a perforated region 8. In addition, the fixed connection position between the fixing element 7C and the base 3 is located at the perforated region 8. It is noted that numerous modifications and alterations may be made while retaining the teachings of the invention. For example, the fixed connection position between the fixing element 7C and the base 3 is located beside the thermal conduction structure 32C, i.e., located at the region outside the thermal conduction structure 32C.

Figure 12:
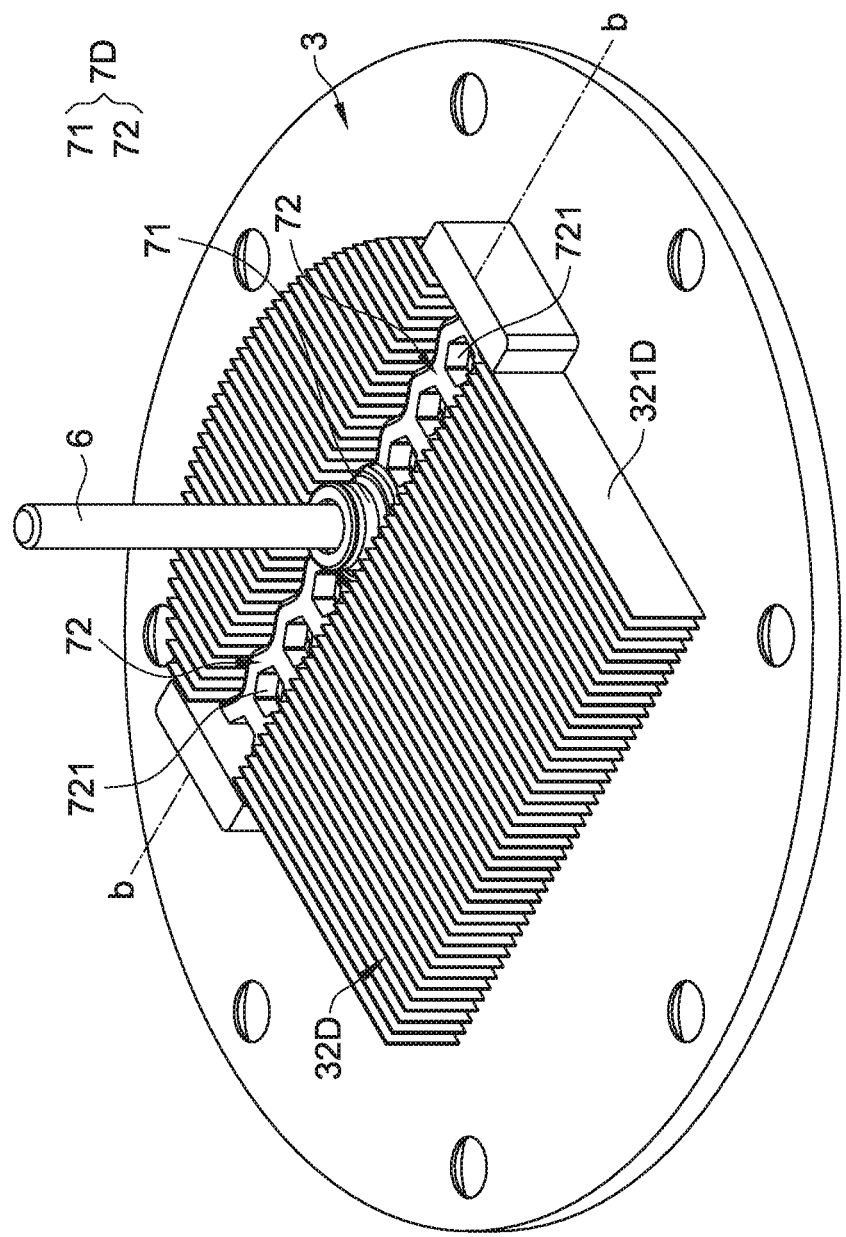
FIG. 12 is a schematic perspective view illustrating a base, a thermal conduction structure, a fixing element and a shaft of a water-cooling head according to a fourth embodiment of the present invention.
Figure 13:
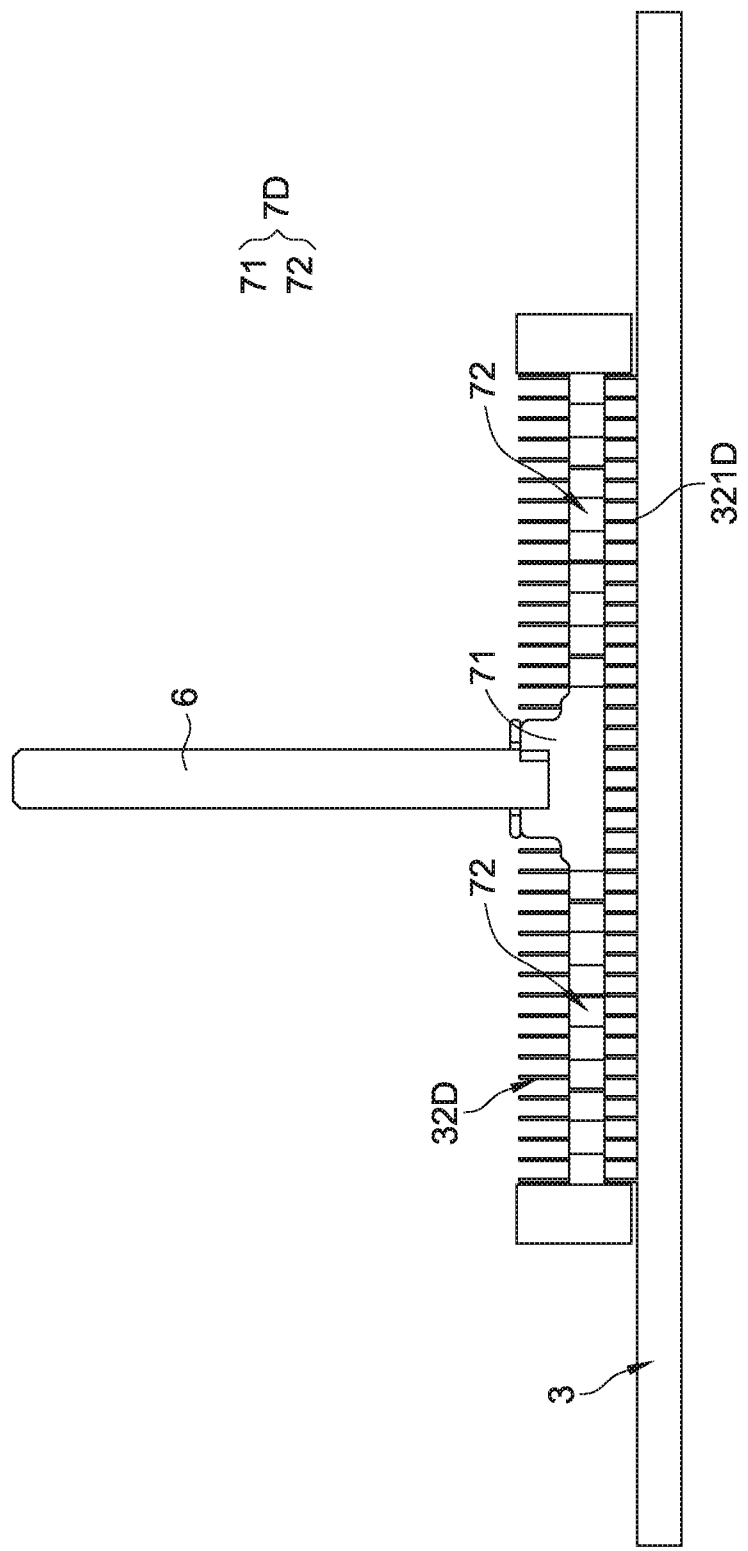
FIG. 13 is a schematic cross-sectional view illustrating the base, the thermal conduction structure, the fixing element and the shaft of the water-cooling head as shown in FIG. 12 and taken along the line b-b.
Figure 14:
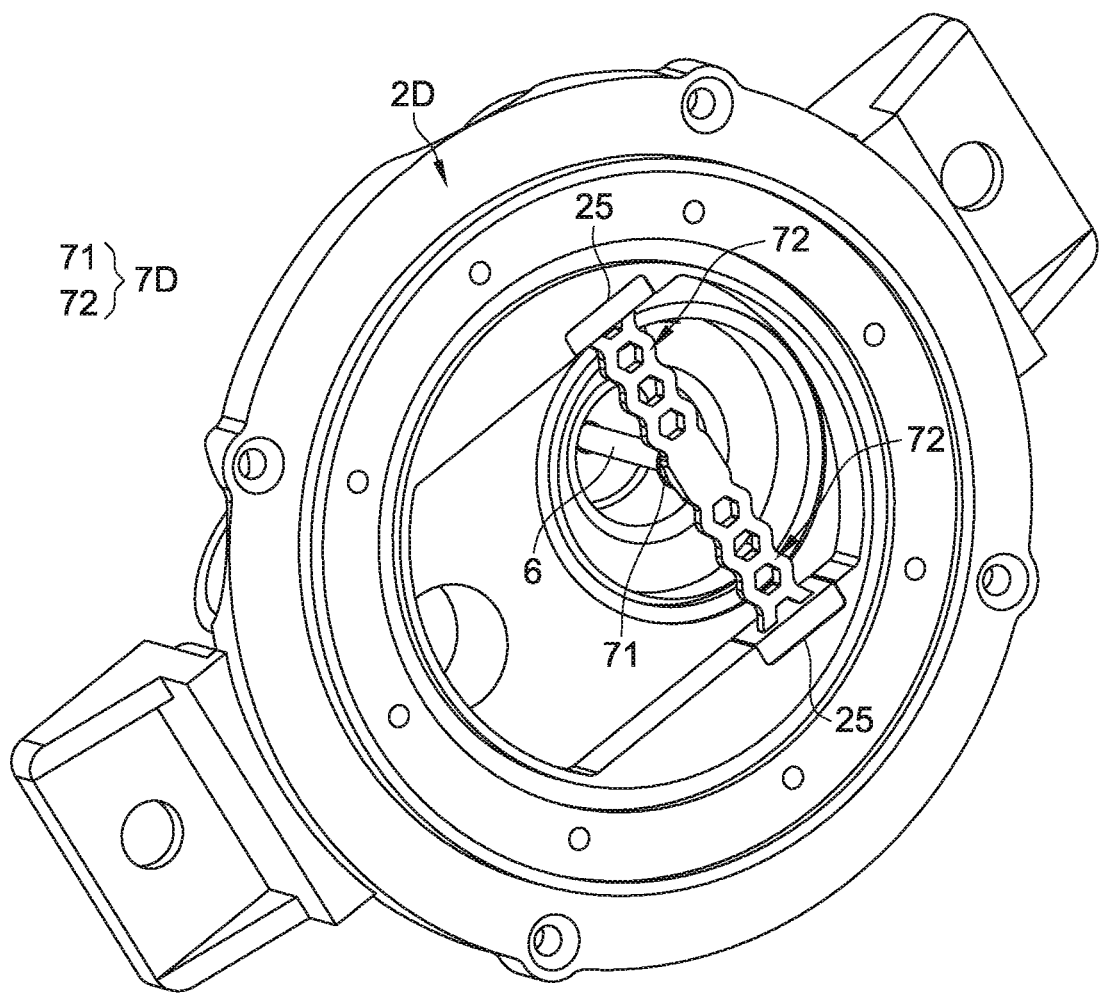
FIG. 14 is a schematic cross-sectional view illustrating the fixed connection between the fixing element and the casing of the water-cooling head as shown in FIG. 12.

Please refer to FIGS. 12, 13 and 14. FIG. 12 is a schematic perspective view illustrating a base, a thermal conduction structure, a fixing element and a shaft of a water-cooling head according to a fourth embodiment of the present invention. FIG. 13 is a schematic cross-sectional view illustrating the base, the thermal conduction structure, the fixing element and the shaft of the water-cooling head as shown in FIG. 12 and taken along the line b-b. FIG. 14 is a schematic cross-sectional view illustrating the fixed connection between the fixing element and the casing of the water-cooling head as shown in FIG. 12. In comparison with the first embodiment, the fixing element 7D and the casing 2D are fixedly connected with each other. The other components of the water-cooling head of this embodiment are similar to those of the first embodiment, and are not redundantly described herein.

In this embodiment, plural fixing parts 25 are disposed on the inner side of the casing 2D. The fixing element 7D comprises a pedestal 71 and plural wing parts 72. The first end of the shaft 6 is fixed on the pedestal 71. A first end of each wing part 72 is connected with the pedestal 71. A second end of each wing part is extended toward the casing 2D and fixedly connected with the corresponding fixing part 25 of the casing 2D. In this embodiment, the concave structure 3211D is defined by some of the fins 321D of the thermal conduction structure 32D collaboratively. When the fixing element 7D and the casing 2D are fixedly connected with each other, at least a portion of the fixing element 7D is accommodated within the concave structure 3211D and contacted with top ends of the corresponding fins 321D. It is noted that numerous modifications and alterations may be made while retaining the teachings of the invention. Alternatively, each wing part 72 comprises plural openings 721. The working medium is allowed to pass through the openings 721. Consequently, the flowing property of the working medium is not adversely affected.

Figure 15:
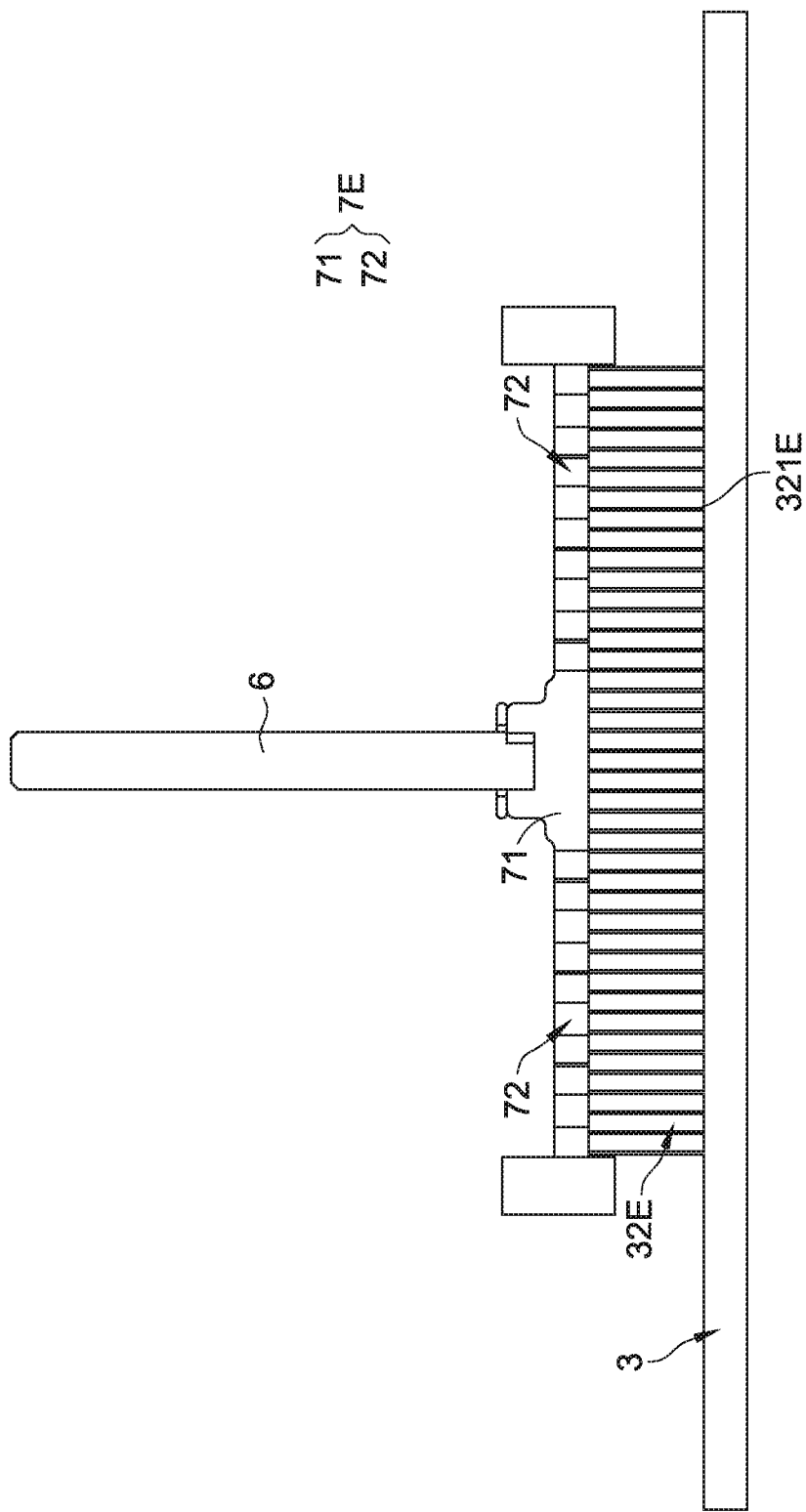
FIG. 15 is a schematic cross-sectional view illustrating a fixing element and a thermal conduction structure of a water-cooling head according to a fifth embodiment of the present invention when the fixing element is fixedly connected with a casing.

FIG. 15 is a schematic cross-sectional view illustrating a fixing element and a thermal conduction structure of a water-cooling head according to a fifth embodiment of the present invention when the fixing element is fixedly connected with a casing. In comparison with the fourth embodiment, the thermal conduction structure 32E of the water-cooling head of this embodiment is distinguished. The other components of the water-cooling head of this embodiment are similar to those of the fourth embodiment, and are not redundantly described herein. When the fixing element 7E is fixedly connected with the casing (see FIG. 14), the entire of the fixing element 7E is exposed outside the thermal conduction structure 32E. In this embodiment, the bottom surface of the fixing element 7E is still contacted with top ends of the corresponding fins 321E.

FIG. 16 is a schematic cross-sectional view illustrating a fixing element and a thermal conduction structure of a water-cooling head according to a sixth embodiment of the present invention when the fixing element is fixedly connected with a casing. In comparison with the fourth embodiment, the thermal conduction structure 32F of the water-cooling head of this embodiment is distinguished. The other components of the water-cooling head of this embodiment are similar to those of the fourth embodiment, and are not redundantly described herein. When the fixing element 7E is fixedly connected with the casing (see FIG. 14), the fixing element 7F is in contact with an inner surface of the base and the fixing element 7F is located at the region outside the thermal conduction structure 32F.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:

1. A water-cooling head, comprising:
   a casing;
   a base, wherein an active space is defined by the base and the casing collaboratively, and a working medium is filled in the active space;
   a thermal conduction structure disposed on an inner side of the base, wherein heat is transferred to the working medium through the base and the thermal conduction structure sequentially; and
   a pump comprising a fixing element, a shaft and an impeller, the impeller comprising a seat part and a hollow part, the seat part dividing the active space into a heat-absorbing space and a drainage space, the thermal conduction structure being disposed within the heat-absorbing space, wherein after the fixing element is fixed, the fixing element is contacted with the base or contacted with the thermal conduction structure, and the shaft is installed and fixed on the fixing element, wherein the impeller is sheathed around the shaft and rotated about the shaft to drive the working medium to flow from the heat-absorbing space upwardly to the drainage space through the hollow part.

2. The water-cooling head according to claim 1, wherein the thermal conduction structure is a fin group or a sintered heat-dissipating structure.

3. The water-cooling head according to claim 1, wherein a first end of the shaft is fixed on the fixing element, and a second end of the shaft is fixed on an inner side of the casing.

4. The water-cooling head according to claim 1, wherein the fixing element and the thermal conduction structure are fixedly connected with each other.

5. The water-cooling head according to claim 4, wherein the thermal conduction structure comprises plural fins, and the fixing element is fixedly connected with a top end of at least one of the plural fins.

6. The water-cooling head according to claim 4, wherein the thermal conduction structure comprises a concave structure, and at least a portion of the fixing element is accommodated within the concave structure.

7. The water-cooling head according to claim 1, wherein the fixing element and the base are fixedly connected with each other.

8. The water-cooling head according to claim 1, wherein the fixing element and the casing are fixedly connected with each other.

9. The water-cooling head according to claim 8, wherein the fixing element comprises at least one wing part and a pedestal, wherein an end of the shaft is fixed on the pedestal, a first end of each wing part is connected with the pedestal, and a second end of each wing part is extended toward the casing and fixedly connected with the casing.

10. The water-cooling head according to claim 9, wherein each wing part comprises at least one opening, and the working medium flows through the at least one opening.

11. The water-cooling head according to claim 8, wherein the thermal conduction structure comprises plural fins, wherein when the fixing element is fixedly connected with the casing, the fixing element is contacted with a top end of at least one of the plural fins.

12. The water-cooling head according to claim 8, wherein the thermal conduction structure comprises a concave structure, wherein when the fixing element is fixedly connected with the casing, at least a portion of the fixing element is accommodated within the concave structure.

13. The water-cooling head according to claim 8, wherein the thermal conduction structure comprises plural fins, wherein when the fixing element is fixedly connected with the casing, the fixing element is contacted with an inner side of the base.

14. The water-cooling head according to claim 1, wherein the water-cooling head further comprises an input channel and an output channel, which are in communication with the active space, wherein the water-cooling head is connected with a heat changer, the working medium is cooled by the heat changer after the working medium is outputted from the output channel, and the cooled working medium is introduced into the active space through the input channel.

15. A water-cooling head, comprising:
an active space, wherein a working medium is filled in the active space;
a thermal conduction structure disposed on a base and accommodated within the active space, wherein heat is transferred to the working medium through the base and the thermal conduction structure sequentially; and
a pump comprising a fixing element, a shaft and an impeller, the impeller comprising a seat part and a hollow part, the seat part dividing the active space into a heat-absorbing space and a drainage space, the thermal conduction structure being disposed within the heat-absorbing space, wherein after the fixing element is fixed, the fixing element is contacted with the base or contacted with the thermal conduction structure, wherein the shaft is installed and fixed on the fixing element, the impeller is sheathed around the shaft, and the drainage space is divided into plural spaces by the impeller, wherein when the impeller is rotated about the shaft, the working medium is driven to flow from the heat-absorbing space upwardly to the drainage space through the hollow part.

16. The water-cooling head according to claim 15, wherein the thermal conduction structure is a fin group or a sintered heat-dissipating structure.

17. The water-cooling head according to claim 15, wherein the fixing element and the thermal conduction structure are fixedly connected with each other.

18. The water-cooling head according to claim 17, wherein the thermal conduction structure comprises plural fins, and the fixing element is fixedly connected with a top end of at least one of the plural fins.

19. The water-cooling head according to claim 17, wherein the thermal conduction structure comprises a concave structure, and at least a portion of the fixing element is accommodated within the concave structure.

20. The water-cooling head according to claim 15, wherein the fixing element and the base are fixedly connected with each other.

21. The water-cooling head according to claim 15, wherein the water-cooling head further comprises a casing, wherein the active space is defined by the casing and the base collaboratively, and the fixing element and the casing are fixedly connected with each other.

22. The water-cooling head according to claim 21, wherein the fixing element comprises at least one wing part and a pedestal, wherein an end of the shaft is fixed on the pedestal, a first end of each wing part is connected with the pedestal, and a second end of each wing part is extended toward the casing and fixedly connected with the casing.

23. The water-cooling head according to claim 22, wherein each wing part comprises at least one opening, and the working medium flows through the at least one opening.

24. The water-cooling head according to claim 21, wherein the thermal conduction structure comprises plural fins, wherein when the fixing element and the casing are fixedly connected with each other, the fixing element is contacted with a top end of at least one of the plural fins.

25. The water-cooling head according to claim 21, wherein the thermal conduction structure comprises a concave structure, wherein when the fixing element is fixedly connected with the casing, at least a portion of the fixing element is accommodated within the concave structure.

26. The water-cooling head according to claim 21, wherein when the fixing element and the casing are fixedly connected with each other, the fixing element is contacted with an inner side of the base.

27. The water-cooling head according to claim 15, wherein the water-cooling head further comprises an input channel and an output channel, which are in communication with the active space, wherein the water-cooling head is connected with a heat changer, the working medium is cooled by the heat changer after the working medium is outputted from the output channel, and the cooled working medium is introduced into the active space through the input channel.

* * * * *